US009478396B2

(12) United States Patent
Hamaguchi et al.

(10) Patent No.: US 9,478,396 B2
(45) Date of Patent: Oct. 25, 2016

(54) CHARGED PARTICLE BEAM EXPOSURE APPARATUS

(71) Applicant: ADVANTEST CORPORATION, Tokyo (JP)

(72) Inventors: Shinichi Hamaguchi, Tokyo (JP); Masaki Kurokawa, Tokyo (JP); Shinji Sugatani, Tokyo (JP); Akio Yamada, Tokyo (JP)

(73) Assignee: Advantest Corp., Tokyo (JP)

( * ) Notice: Subject to any disclaimer, the term of this patent is extended or adjusted under 35 U.S.C. 154(b) by 0 days.

(21) Appl. No.: 14/562,095

(22) Filed: Dec. 5, 2014

(65) Prior Publication Data
US 2015/0200074 A1    Jul. 16, 2015

(30) Foreign Application Priority Data

Jan. 14, 2014  (JP) ................................. 2014-003927

(51) Int. Cl.
  *H01J 37/317*  (2006.01)
  *H01J 37/30*  (2006.01)
(52) U.S. Cl.
  CPC ........ *H01J 37/3177* (2013.01); *H01J 37/3007* (2013.01); *H01J 2237/0435* (2013.01); *H01J 2237/0453* (2013.01)
(58) Field of Classification Search
  CPC ............. H01J 37/3007; H01J 37/3045; H01J 37/3174; H01J 37/3177; H01J 2237/0435
  See application file for complete search history.

(56) References Cited

U.S. PATENT DOCUMENTS

| 4,724,328 | A | * | 2/1988 | Lischke | ................. | B82Y 10/00 250/396 R |
| 6,262,428 | B1 | * | 7/2001 | Ito | .......................... | B82Y 10/00 250/492.22 |
| 2012/0286170 | A1 | * | 11/2012 | Van De Peut | ......... | B82Y 10/00 250/397 |
| 2013/0043413 | A1 | * | 2/2013 | De Boer | ................. | B82Y 10/00 250/492.3 |
| 2014/0106268 | A1 | * | 4/2014 | Imaoka | ................. | H01J 37/067 430/30 |

FOREIGN PATENT DOCUMENTS

JP    61-187234    8/1986

OTHER PUBLICATIONS

Yasuda et al. "Fast Electron Beam Lithography System with 2014 Beams Individually Controlled by Blanking Aperture Array", Jpn. J. Appl. Phys. vol. 32 (1993) pp. 6012-6017.

* cited by examiner

*Primary Examiner* — Wyatt Stoffa
*Assistant Examiner* — Eliza Osenbaugh-Stewar
(74) *Attorney, Agent, or Firm* — Muramatsu & Associates

(57) ABSTRACT

Provided is a charged particle beam exposure apparatus configured as follows. An electron beam emitted from an electron gun is deformed by an asymmetric illumination optical system to have an elongated section. The electron beam is then applied to a beam shaping aperture plate provided with a plurality of apertures arranged in a line, thereby generating a plurality of electron beams. Exposure of a predetermined pattern is performed on a semiconductor substrate by moving a stage device in a direction orthogonal to line patterns on the semiconductor substrate and turning the plurality of electron beams on or off in synchronization with the movement of the stage device by use of a blanker plate and a final aperture plate.

14 Claims, 17 Drawing Sheets

ΔX ~ ΔY × θ

CHARGED PARTICLE BEAM EXPOSURE APPARATUS

CROSS-REFERENCE TO RELATED APPLICATION

This application is based upon and claims the benefit of priority of the prior Japanese Patent Application No. 2014-3927, filed Jan. 14, 2014, the entire contents of which are incorporated herein by reference.

FIELD

The embodiments discussed herein are related to a charged particle beam exposure apparatus which performs exposure using a plurality of charged particle beams.

BACKGROUND

With the development of high integration of semiconductor devices, there is a need for an exposure technique for achieving finer patterns, and a new exposure technique is under development. A currently-used light exposure technique uses light from an ArF source. However, due to the long wavelength of such light, it is said that exposure of complicated patterns having a line width of 10 nm or smaller is difficult with this exposure technique.

An exposure technique using charged particle beams is advantageous because charged particle beams have very short wavelength and therefore provide essentially high resolution. However, it is difficult to obtain charged particle beams having sufficient intensity with the exposure technique using charged particle beams. For this reason, a practical processing speed cannot be achieved if only the charged particle beam exposure technique is used to draw fine patterns.

Thus, complementary lithography has been proposed, in which an immersion exposure technique using an ArF light source and a charged particle beam exposure technique are used in a complementary manner. Such complementary lithography is shown, for example, in "Japanese Laid-open Patent Publication No. 61-187234" and "Yasuda et al., Japanese Journal of Applied Physics., Vol. 32, 6012, (1993)".

In complementary lithography, a simple line-and-space pattern is formed by using double patterning through the immersion exposure using the ArF light source. Next, cutting of the line patterns and formation of via holes are performed through the charged particle beam exposure.

In this lithography technique, the area of a portion exposed to charged particle beams is only about several percent of the overall area of the pattern. For this reason, exposure can be completed with less radiation than in a case where exposure of the pattern is performed using only electron beams for the entire area. This possibly increases throughput.

SUMMARY

Thus, the present invention has an objective of providing a charged particle beam exposure apparatus suitable for lithography using light exposure and charged particle beam exposure in a complementary lithography.

According to an aspect of a technique disclosed below, a charged particle beam exposure apparatus includes: a charged particle source configured to emit a charged particle beam; a beam shaping aperture plate including a plurality of apertures arranged in a line and being configured to shape the charged particle beam into a plurality of charged particle beams; a blanker plate including aperture portions and blanking electrodes and being configured to deflect the charged particle beams individually, the aperture portions being provided at portions corresponding to the apertures of the beam shaping aperture plate; a final aperture plate configured to block the charged particle beams deflected by the blanker plate and allow to pass therethrough the charged particle beams not deflected by the blanker plate; a charged particle optical system configured to reduce in size the plurality of charged particle beams shaped by the beam shaping aperture plate and form an image thereof; a stage device configured to retain and move a semiconductor substrate on which a plurality of line patterns are formed at a certain pitch; and a controller configured to perform an overall operation of exposure of a predetermined pattern on the semiconductor substrate by moving the stage device and turning the plurality of charged particle beams on or off in synchronization with the movement of the stage device.

The charged particle beam exposure apparatus according to the above aspect may be provided with an asymmetric illumination optical system placed between the charged particle source and the beam shaping aperture plate and configured to deform the charged particle beam emitted from the charged particle source into a beam having a section elongated along the line of the apertures of the beam shaping aperture plate.

According to the electron beam exposure apparatus of the above aspect, exposure of patterns can be performed by turning the plurality of charged particle beams on or off in synchronization with the movement of the stage device. This enables simplification of an optical system for adjusting the irradiation positions of the charged particle beams.

The provision of the asymmetric illumination optical system allows reduction of loss of charged particle beams to obtain charged particle beams having higher current density. Thus, throughput of exposure can be improved even more.

DESCRIPTION OF EMBODIMENTS

Before describing embodiments, a description of complementary lithography is given.

Figure 1A:
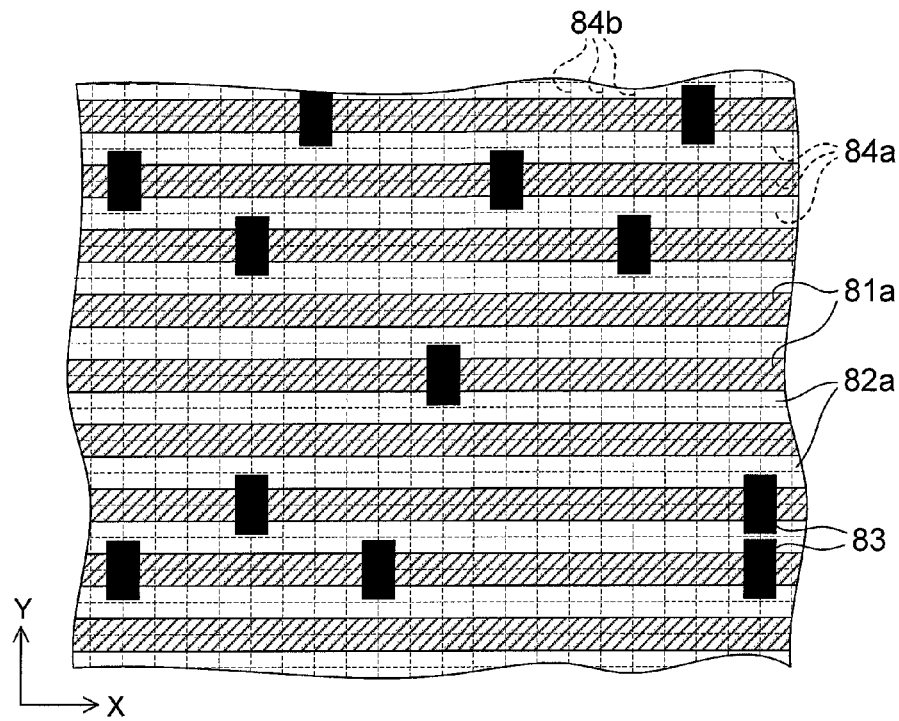
FIGS. 1A and 1B are diagrams each illustrating complementary lithography.
Figure 1B:
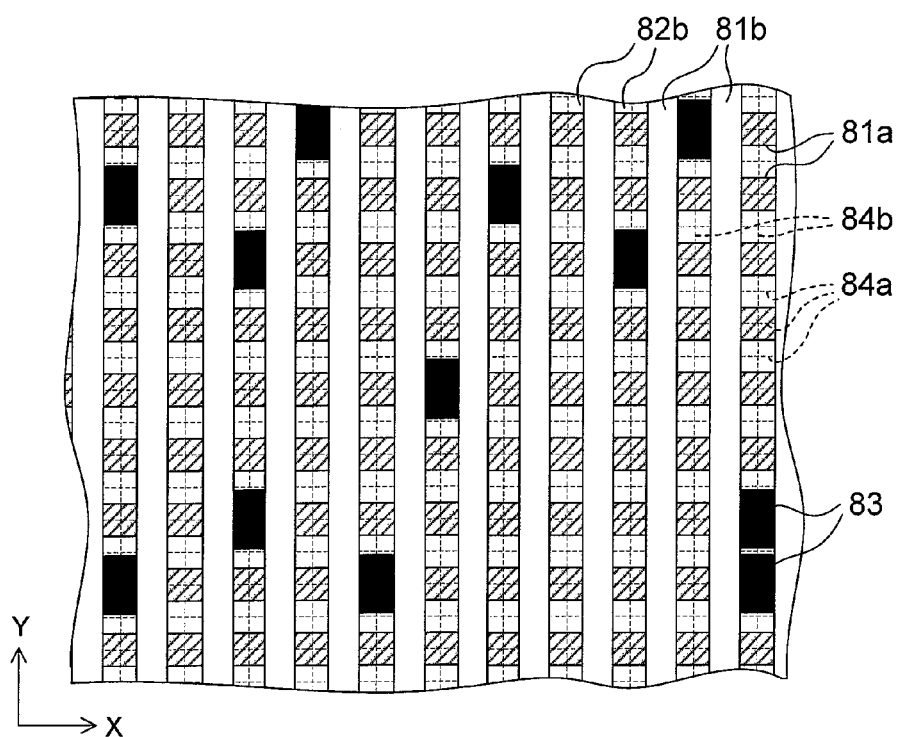

FIGS. 1A and 1B are diagrams illustrating complementary lithography.

In complementary lithography, a wiring pattern is formed by alternately superimposing wiring layers each formed by a pattern of lateral lines and wiring layers each formed by a pattern of vertical lines.

FIG. 1A shows an example of a line-and-space pattern on an N-th layer of the wiring layers on a semiconductor substrate and arrangement of cut patterns 83 for cutting line patterns of the line-and-space pattern. In the line-and-space pattern shown in FIG. 1A, line patterns 81a and spaces 82a having certain widths and extending laterally (in an X direction) are alternately arranged. This line-and-space pattern is formed using a narrow-pitch technique combining immersion exposure using an ArF light source and double patterning.

The cut patterns 83 are not simple lines but fine rectangular patterns. Thus, it is difficult to form the cut patterns 83 with light exposure using the ArF light source. For this reason, exposure of the cut patterns 83 is performed using electron beams (charged particle beams) excellent in resolution.

In FIG. 1A, lines 84a, 84b forming grids are lines set in design data to indicate arrangement positions of patterns. The line patterns 81a and the spaces 82a are arranged along the lateral lines 84a.

The cut patterns 83, on the other hand, are arranged along the vertical lines 84b. The shape of each cut pattern 83 is not limited as long as it is a rectangular pattern having a length which cuts across the line pattern 81a vertically. As shown in FIG. 1A, the cut patterns 83 occupy only a small percent of the entire area. Thus, practical throughput can be obtained even with electron beam exposure.

FIG. 1B is a diagram showing an example of a positional relation between a line-and-space pattern on an N+1-th layer and the cut patterns 83 on the N-th layer.

As shown in FIG. 1B, the line-and-space pattern on the N+1-th layer is formed by alternately arranging line patterns 81b and spaces 82b having certain widths and extending vertically (in a Y direction). The line patterns 81b are arranged along the vertical lines 84b in the design data.

Via holes are formed at intersections of the lateral line patterns 81a and the vertical line patterns 81b to connect these patterns to each other.

If displaced laterally, the cut patterns 83 may interfere with the via hole pattern. For this reason, the cut patterns 83 are required to be arranged accurately between the line patterns 81b, and needs accuracy in the lateral direction. On the other hand, since the vertical length of each cut pattern 83 is larger than the line width of each line pattern 81a, small vertical displacement of the cut pattern 83 is not so problematic.

Focusing on the properties of the cut patterns 83 described above, an electron beam exposure apparatus with a simple apparatus configuration capable of efficient electron beam exposure using many electron beams is described in the following embodiments.

First Embodiment

Figure 2:
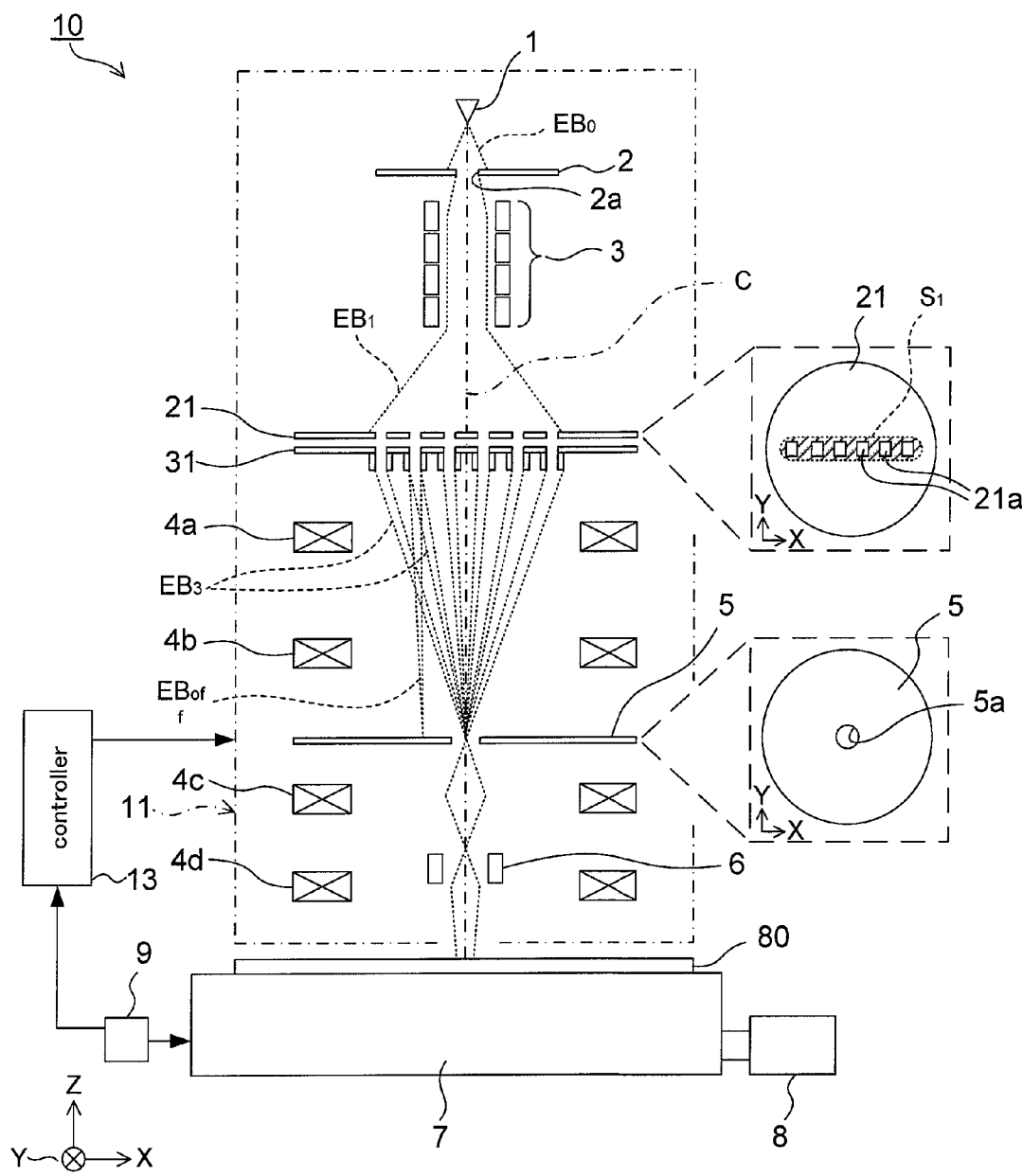
FIG. 2 is a block diagram of an electron beam exposure apparatus according to a first embodiment.

FIG. 2 is a block diagram of an electron beam exposure apparatus according to a first embodiment.

As shown in FIG. 2, an electron beam exposure apparatus according to this embodiment includes a cylindrical casing (column cell) 11 housing an electron gun 1 configured to generate an electron beam $EB_0$ and an optical system of the electron beam exposure apparatus 10, a stage device 7 placed below the column cell 11, and a controller 13 configured to control each unit.

The electron gun 1 in the column cell 11 emits the electron beam $EB_0$ having a predetermined accelerating voltage (e.g., 50 keV). By passing through an aperture 2a of a first aperture plate 2, the electron beam $EB_0$ is shaped into a beam having a circular section symmetrical about an optical axis C.

An asymmetric illumination optical system 3 is placed below the first aperture plate 2, and generates an electron beam $EB_1$ by deforming the electron beam $EB_0$ into a beam having an elongated section which is long in one direction (the X direction) and short in another direction (the Y direction).

Figure 3:
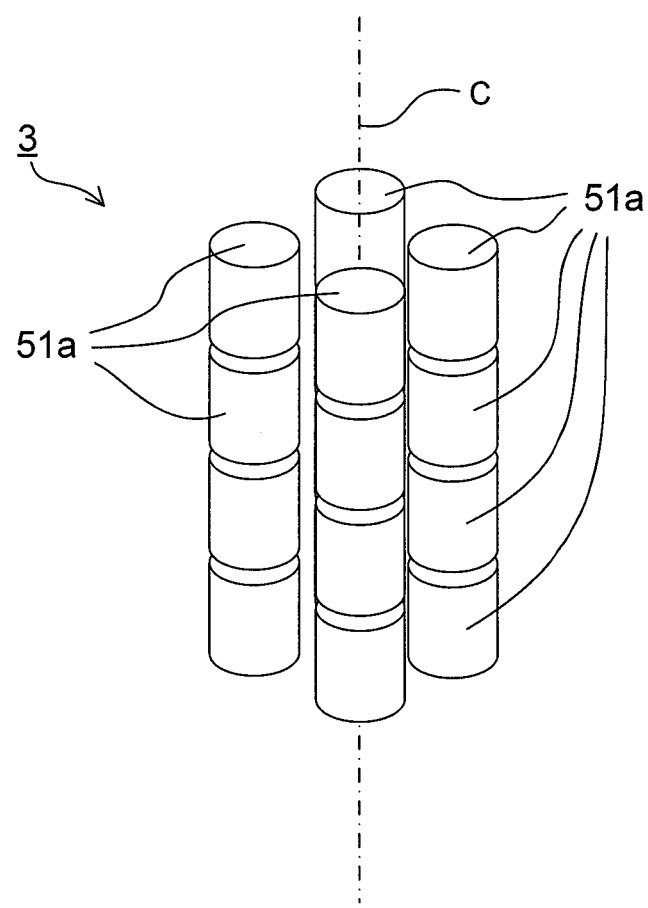
FIG. 3 is a perspective view showing electrostatic quadrupole electrodes.

FIG. 3 is a perspective view showing an example of the asymmetric illumination optical system 3 as a group of electrostatic quadrupole lenses.

As shown in FIG. 3, the asymmetric illumination optical system 3 is formed of electrostatic quadrupole electrodes 51a arranged about the optical axis C and stacked in four layers, and generates an electric quadrupole magnetic field near the optical axis C. The electron beam $EB_1$ having an elongated section can be formed through appropriate adjustment of this electrostatic quadrupole magnetic field.

Referring back to FIG. 2, the electron beam EB1 is applied to an irradiation region $S_1$ of a beam shaping aperture plate 21.

The beam shaping aperture plate 21 is provided with a line of aperture portions 21a arranging in the same direction as a longitudinal direction (X direction) of the irradiation region $S_1$ for the electron beam $EB_1$. These aperture portions 21a shape the electron beam $EB_1$ into a plurality of electron beams $EB_3$ as many as the aperture portions 21a.

Figure 4A:
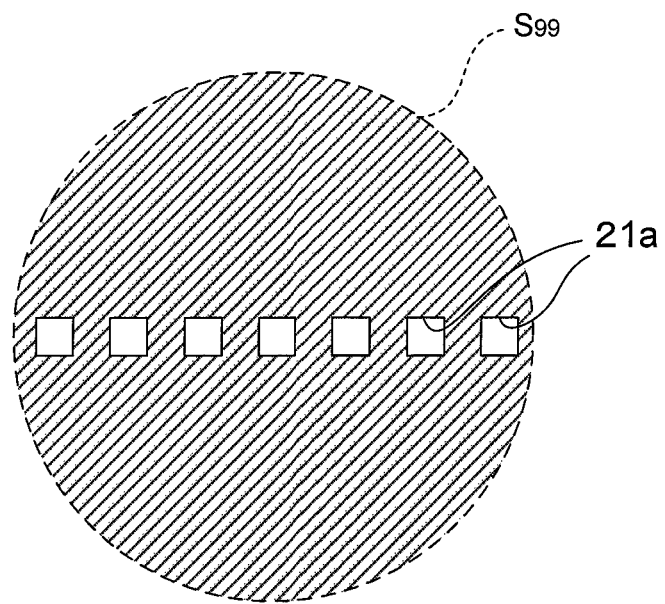
FIG. 4A is a diagram showing a region irradiated with an electron beam according to a comparative example.
Figure 4B:
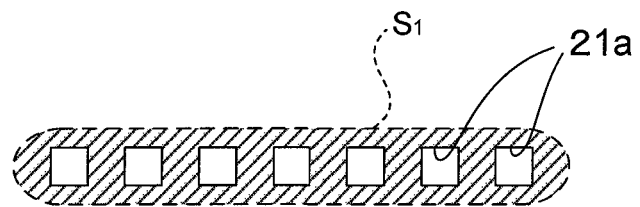
FIG. 4B is a diagram showing a region irradiated with an electron beam by use of an asymmetric illumination optical system.

FIG. 4A is a diagram showing an irradiation region $S_{99}$ for the electron beam $EB_1$ according to a comparative example, and FIG. 4B is a diagram showing the electron beam irradiation region $S_1$ according to this embodiment.

In the comparative example shown in FIG. 4A, an electron beam which is circular in section is directly applied without using the asymmetric illumination optical system 3. Thus, the aperture portions 21a occupy a small percentage of the irradiation region $S_{99}$. In the comparative example, therefore, a majority of electrons emitted from the electron gun 1 are not used and discarded, and the current density of the electron beams $EB_3$ passing through the beam shaping aperture plate 21 is low.

In contrast, in this embodiment, as shown in FIG. 4B, the electron beam EB1 is applied to the beam shaping aperture plate 21 after being elongated by the asymmetric illumination optical system 3. In this case, the aperture portions 21a occupy an increased percentage of the irradiation region S1 for the electron beam EB1, allowing more electrons to be utilized for the exposure. Hence, the electron beams EB3 with a larger current density can be generated, allowing a pattern to be drawn through radiation of a shorter period of time.

In this embodiment, the aperture portions 21a of the beam shaping aperture plate 21 are arranged in a line in a direction orthogonal to a direction in which the stage device 7 moves during exposure, so that the plurality of electron beams $EB_3$ move at the same time.

A blanker plate 31 is placed below the beam shaping aperture plate 21 in FIG. 2.

Figure 5A:
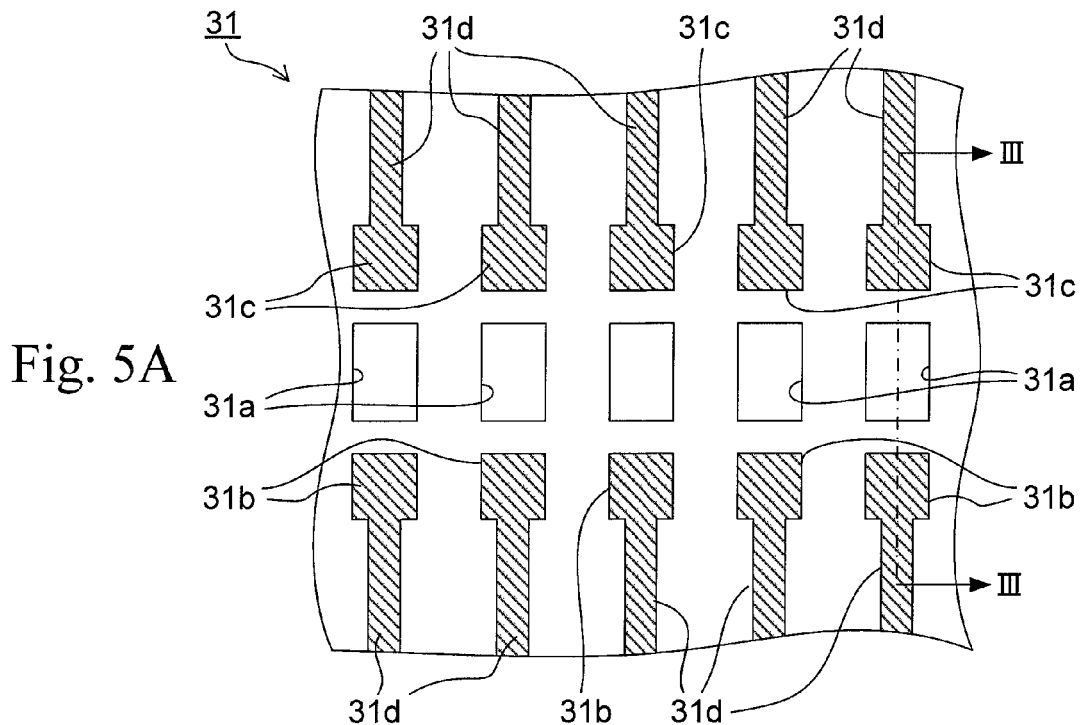
FIG. 5A is a plan view of a blanker plate.
Figure 5B:
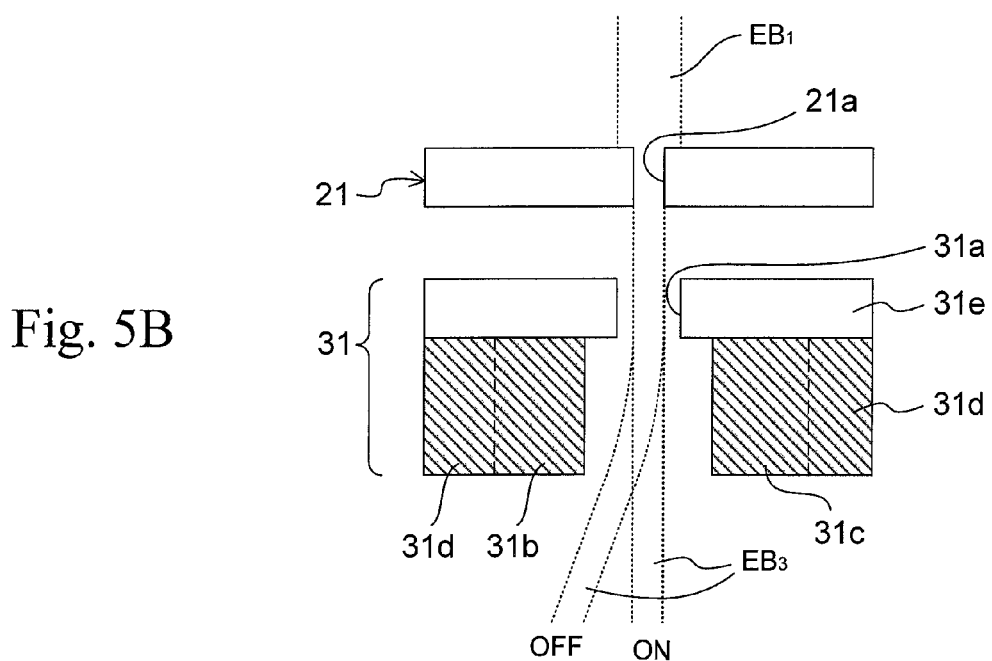
FIG. 5B is a sectional view taken along line in FIG. 5A.

FIG. 5A is an enlarged plan view of the blanker plate 31, and FIG. 5B is a sectional view taken along line in FIG. 5A.

As shown in FIG. 5A, the blanker plate 31 is placed near the beam shaping aperture plate 21, and apertures 31a are provided in a main body 31e of the blanker plate 31. The apertures 31a are each larger than each aperture portion 21a and permit the electron beams $EB_3$ to pass therethrough. On the sides of each aperture 31a, blanking electrodes 31b, 31c for deflecting the electron beam $EB_3$ are provided. The blanking electrodes 31b, 31c are connected to a drive circuit via interconnections 31d and terminals (not shown). The blanking electrodes 31b, 31c and the interconnections 31d are formed integrally by patterning of a conductive film on the main body 31e of the blanker plate 31, the conductive film having a thickness of about several micrometers to several tens of micrometers. The blanking electrodes 31b, 31c are preferably formed on a surface which corresponds to the downstream side of the electron beams $EB_3$, for prevention of being damaged by radiation of electron beams.

As shown in FIG. 5B, when voltage is applied to the blanking electrodes 31b, 31c, the electron beams EB3 having passed through the apertures 31a are largely bent, as shown with a track denoted as OFF. As a result, as shown in FIG. 2, an electron beam EBOFF bent by the blanking electrodes 31b, 31c is led to an outside of an aperture 5a of a final aperture plate 5 placed below the blanker plate 31, and thus it is blocked to advance toward the stage 7.

When, on the other hand, voltage is not applied to the blanking electrodes 31b, 31c, the electron beams $EB_3$ pass through the aperture 5a of the final aperture plate 5. In other words, ON/OFF control of each of the electron beams $EB_3$ can be achieved by applying or not applying voltage to its corresponding blanking electrodes 31b, 31c.

Below the blanker plate 31, a first electromagnetic lens 4a, a second electromagnetic lens 4b, a third electromagnetic lens 4c, and a fourth electromagnetic lens 4d are provided. Cooperation of these first to fourth electromagnetic lenses 4a to 4d enables images of the aperture portions 21a of the beam shaping aperture plate 21 to be reduced at a predetermined reduction rate α and formed on a surface of a sample 80.

The final aperture plate 5 is placed between the second electromagnetic lens 4b and the third electromagnetic lens 4c. The circular aperture 5a is provided in the final aperture plate 5 near the optical axis C, and only the electron beams $EB_3$ not reflected by the blanker plate 31 pass therethrough the aperture 5a.

A stage feedback deflector 6 is provided below the final aperture plate 5. This stage feedback deflector 6 has a pair of electrode plates arranged along the line of the aperture portions 21a (the X direction) in such a manner as to sandwich the optical axis C. The stage feedback deflector 6 allows fine adjustment of the irradiation position of the electron beams $EB_3$ in the X direction.

The stage device 7 is provided below the column cell 11. The stage device 7 retains the sample 80 on its upper surface, and is enabled by a drive device 8 to move horizontally and rotate.

Alongside the stage device 7, a position sensor 9 formed of a laser interferometer, a line sensor, or the like is provided to allow accurate measurement of the position of the stage device 7 with a resolution in the order of a micrometer. A detection result of the position sensor 9 is used for control of the drive device 8 and control of the stage feedback deflector 6.

In the electron beam exposure apparatus 10 according to this embodiment described above, exposure of cut patterns and via holes is performed while moving the stage device 7 in the direction orthogonal to the line of the aperture portions 21a (the X direction). The following describes an exposure method for drawing a pattern in this embodiment.

Figure 6A:
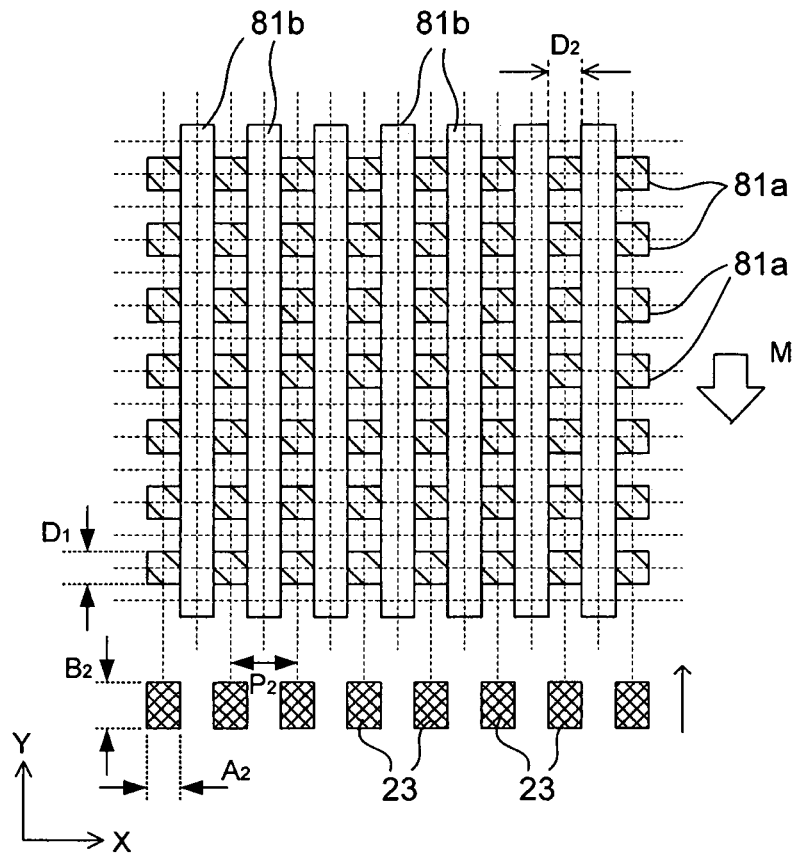
FIG. 6A is a diagram showing how cut patterns are formed in the first embodiment.
Figure 6B:
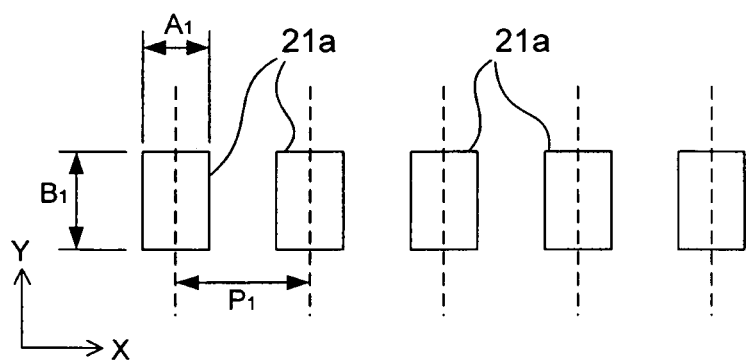
FIG. 6B is a plan view showing the shape of aperture portions of a beam shaping aperture plate.

FIG. 6A is a diagram showing irradiation regions 23 of electron beams for exposure of the line patterns 81a on the N-th layer, and FIG. 6B is an enlarged diagram showing the shapes and an arrangement of the aperture portions 21a of the beam shaping aperture plate 21. Note that, in FIG. 6B, the aperture portions 21a for exposure of a cut pattern is illustrated as an example. Although cut patterns are described herein, a similar exposure method can be used for via-hole patterns as well by changing the shapes and irradiation positions.

As shown in FIG. 6A, the electron beams $EB_3$ are applied to a surface of the sample 80 at the irradiation regions 23 which are obtained by reducing the image of aperture portions 21a at the predetermined reduction rate α. These irradiation regions 23 are rectangular and positioned at the space portions between the line patterns 81b on the N+1-th layer.

A pitch $P_2$ of the irradiation regions 23 is the same as the pitch of the line patterns 81b on the N+1-th layer. An X-direction width $A_2$ of each irradiation region 23 is set to be equal to or smaller than a width $D_2$ of a space between the adjacent line patterns 81b. A Y-direction length $B_2$ of the irradiation region 23 is set to be larger than a width $D_1$ of the line pattern 81a on the N-th layer.

To form such irradiation region 23, a width $A_1$, a length $B_1$, and a pitch $P_1$ of each aperture portion 21a of the beam shaping aperture plate 21 are reduced by the predetermined reduction rate α to achieve the width $A_2$, the length $B_2$, and the pitch $P_2$ of the irradiation region 23.

Note that the width, length, and pitch of cut patterns vary according to a process node defining the line width and pitch of line patterns. Thus, in this embodiment, exposure of the sample 80 for a different process node can be performed using a different beam shaping aperture plate 21 provided with the aperture portions 21a of size and pitch corresponding to that process node.

Next, while moving the stage device 7 in the direction denoted by arrow M in FIG. 6A under the control of the controller 13, exposure of cut patterns is performed by turning desired electron beams $EB_3$ on at the timing when the irradiation regions 23 overlap the line patterns 81a on the N-th layer in a crossing manner.

In this embodiment, the positional shift of the stage device 7 in the X direction is constantly detected by the position sensor 9, and based on the detection result, the stage feedback deflector 6 causes the X-direction positions of the irradiation regions 23 to follow the surface of the sample 80 to ensure accuracy in the X direction.

The stage feedback deflector 6 is also used for correction of error due to a displacement of the sample 80 in the rotational direction.

Figure 7:
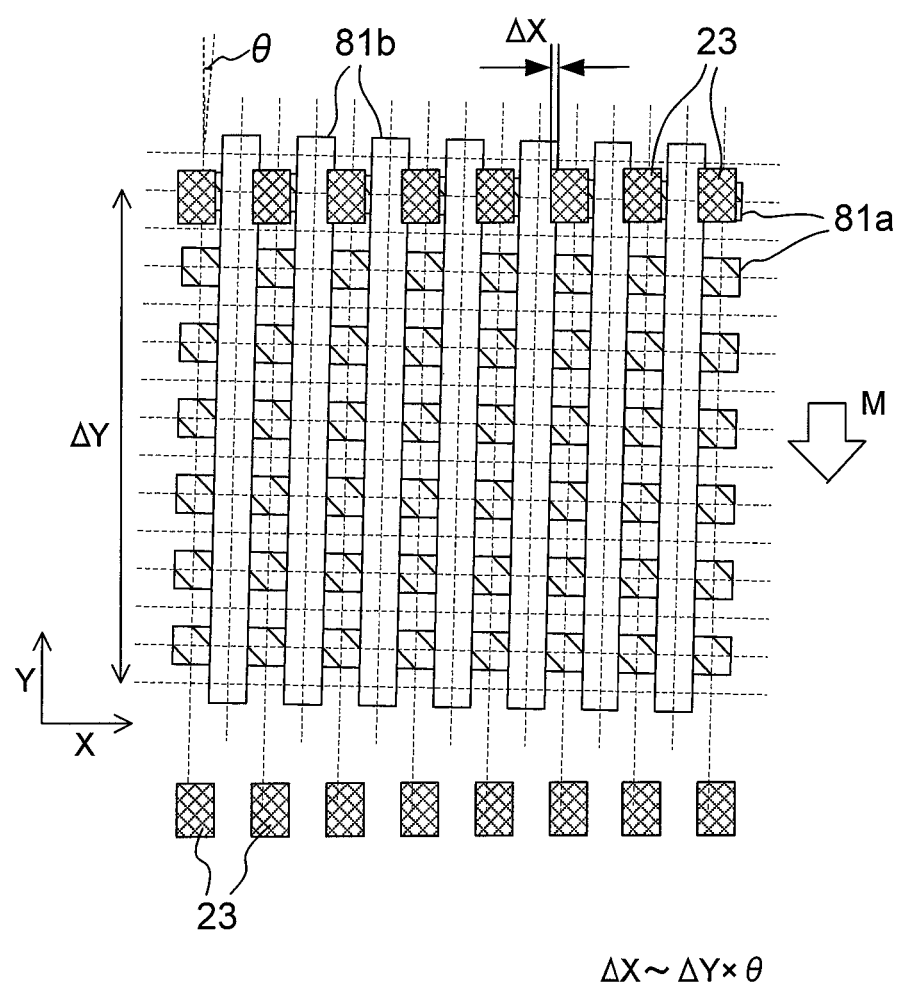
FIG. 7 is a diagram showing how the irradiation regions are corrected to compensate for a displacement of a sample in a rotational direction in the first embodiment.

FIG. 7 is a plan view illustrating a method of correcting the irradiation regions 23 to compensate for displacement of the sample 80 in the rotational direction.

The displacement in the rotational direction occurs due to the mechanical accuracy of the stage device 7 or an error caused in placing the sample 80 on the stage device 7. As shown in FIG. 7, as the stage device 7 moves more in the Y direction, a positional shift $\Delta X$ in the X direction increases. Thus, an angular shift $\Delta\theta$ of the sample 80 in the rotational direction is measured in advance using a positioning mark or the like. And, by the stage feedback deflector 6, the positional shift in the X direction of the irradiation regions 23 occurring with the movement of the stage device 7 in the Y direction is compensated for. Thereby, even if the sample 80 is displaced in the rotational direction, exposure of cut patterns can be performed with high accuracy.

As described above, according to the electron beam exposure apparatus 10 of this embodiment, the aperture portions 21a of the beam shaping aperture plate 21 are arranged in a line one-dimensionally, and the asymmetric illumination optical system 3 changes electron beams in shape so that they may have a flat section corresponding to the line of the aperture portions 21a. Thereby, exposure using a plurality of electron beams $EB_3$ can be performed with high current density without increasing the amount of electrons emitted from the electron gun 1. Thus, exposure of many via-holes and cut patterns can be performed with a short period of time.

In addition, the positioning of the electron beams $EB_3$ can be achieved only with the stage feedback deflector 6, and therefore the electron optical system can be simplified.

Second Embodiment

Figure 8:
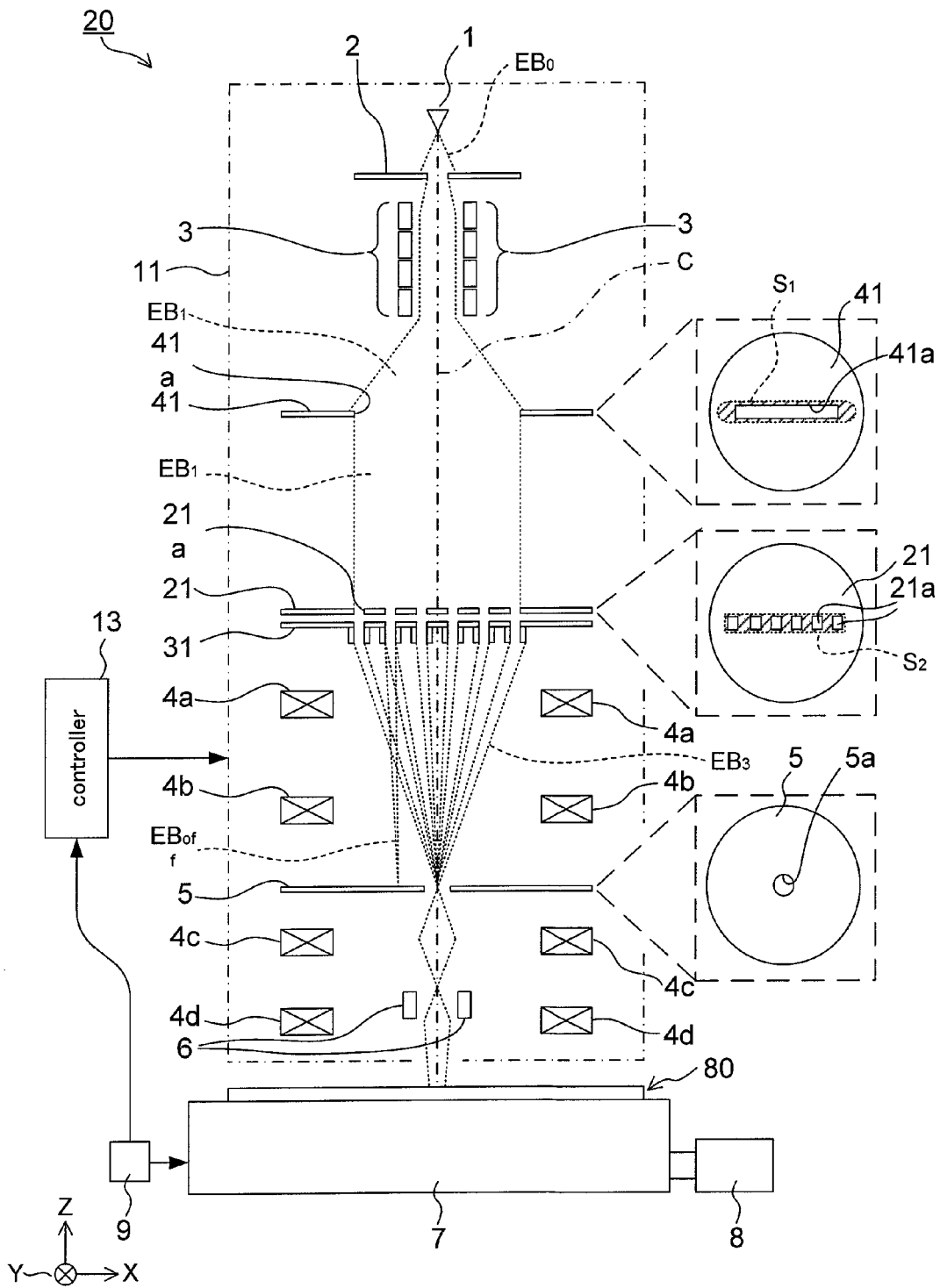
FIG. 8 is a block diagram of an electron beam exposure apparatus according to a second embodiment.

FIG. 8 is a block diagram of an electron beam exposure apparatus 20 according to a second embodiment. Note that configurations of the electron beam exposure apparatus 20 of this embodiment which are the same as those of the electron beam exposure apparatus 10 in FIG. 2 are denoted by the same reference numerals as those used in FIG. 2, and are not described in detail.

As shown in FIG. 8, the electron beam exposure apparatus 20 of this embodiment is different from the electron beam exposure apparatus 10 in that a primary beam shaping plate 41 is placed between the asymmetric illumination optical system 3 and the beam shaping aperture plate 21.

The primary beam shaping plate 41 has a rectangular slit 41a which is slightly larger in width and length than the line of the aperture portions 21a of the beam shaping aperture plate 21. This slit 41a shapes the electron beam $EB_1$ into a beam having a rectangular section and forms a rectangular irradiation region $S_2$ on the beam shaping aperture plate 21.

In this embodiment, the provision of the primary beam shaping plate 41 enables reduction of the amount of electrons with which to irradiate the beam shaping aperture plate 21. This allows prevention of deterioration or damage of the beam shaping aperture plate 21 due to heating up.

The beam shaping aperture plate 21 is an expensive component because highly-accurate microfabrication is performed thereon to form the aperture portions 21a. Thus, deterioration or damage of the beam shaping aperture plate 21 leads to an increase in running costs. Moreover, when the beam shaping aperture plate 21 is deteriorated and requires replacement, the apparatus needs to be stopped, which consequently lowers utilization of the apparatus.

In contrast, in this embodiment, deterioration or damage of the beam shaping aperture plate 21 due to electron beams can be reduced, achieving improvement in the utilization and reduction in operational costs of the electron beam exposure apparatus 20.

In this embodiment, one or a plurality of pairs of electromagnetic lenses for formation of an image of the slit 41a may be provided between the primary beam shaping plate 41 and the beam shaping aperture plate 21. In such a case, the irradiation region $S_2$ on the beam shaping aperture plate 21 can be formed into a sharper shape, allowing reduction in the aberration of electron beams. As a result, sharper images of the aperture portions 21a can be formed on the surface of the sample 80, allowing exposure of fine patterns with high accuracy.

Third Embodiment

Figure 9:
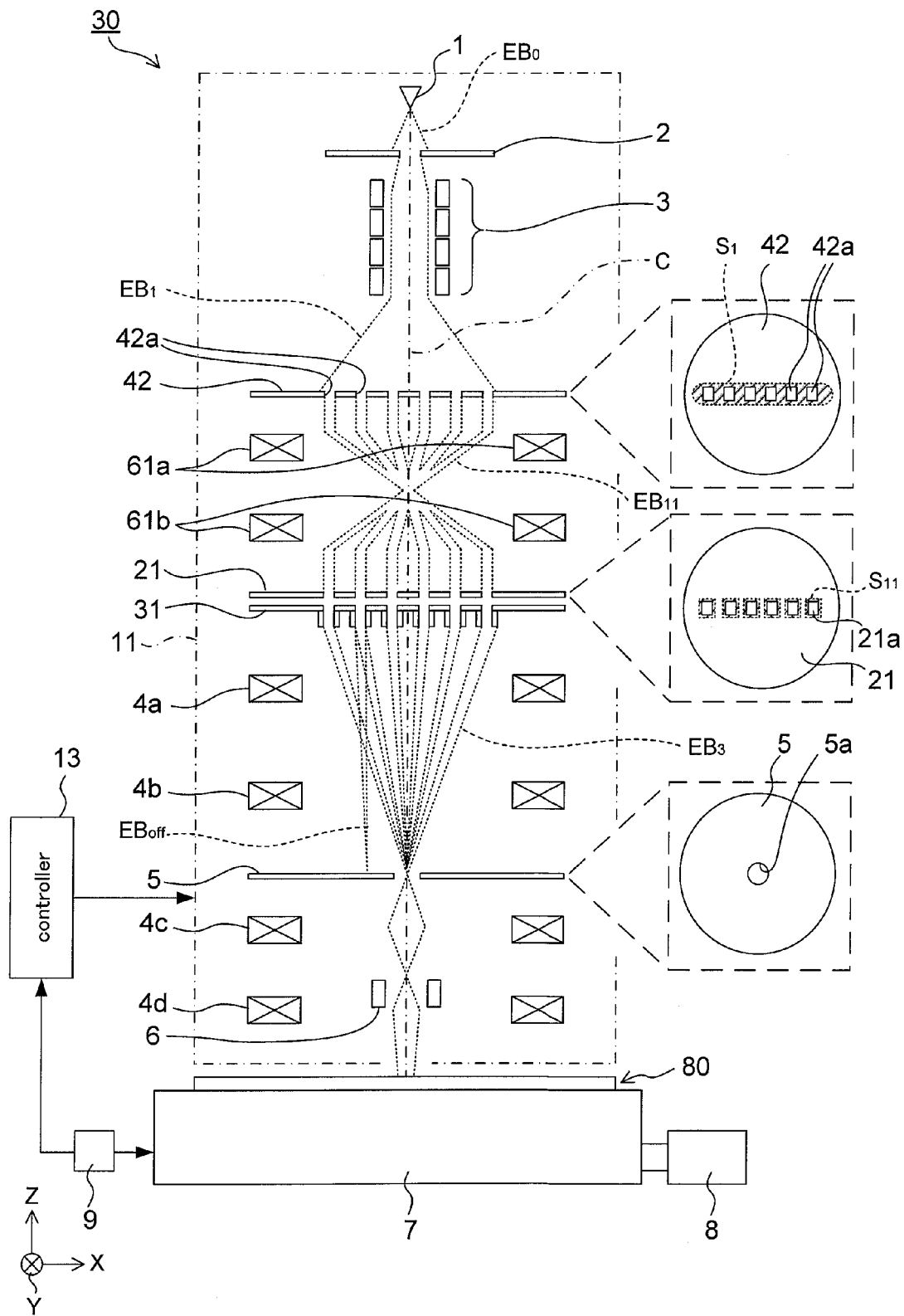
FIG. 9 is a block diagram of an electron beam exposure apparatus according to a third embodiment.

FIG. 9 is a block diagram of an electron beam exposure apparatus 30 according to a third embodiment. Note that configurations of the electron beam exposure apparatus 30 which are the same as those of the electron beam exposure apparatuses 10 and 20 illustrated in FIGS. 2 to 8 are denoted by the same reference numerals as those used in FIGS. 2 to 8, and are not described in detail.

As shown in FIG. 9, the electron beam exposure apparatus 30 of this embodiment has a primary beam shaping plate 42 and electromagnetic lenses 61a, 61b between the asymmetric illumination optical system 3 and the beam shaping aperture plate 21.

The primary beam shaping plate 42 is provided with a line of rectangular aperture portions 42a arranged in the X direction as many as the aperture portions 21a. The aperture portions 42a are larger than the aperture portions 21a of the beam shaping aperture plate 21, and are formed at almost the same pitch as the aperture portions 21a.

The electron beam $EB_1$ shaped to be flat by the asymmetric illumination optical system 3 is applied to an irradiation region $S_1$ of the primary beam shaping plate 42. Then, by passing through the aperture portions 42a of the primary beam shaping plate 42, the electron beam $EB_1$ is shaped into a plurality of rectangular electron beams $EB_{11}$.

Images of the electron beams $EB_{11}$ are formed on the beam shaping aperture plate 21 by the electromagnetic lens 61a and the electromagnetic lens 61b, and the electron beams $EB_{11}$ are thus applied to irradiation regions $S_{11}$ which correspond to the respective aperture portions 21a of the beam shaping aperture plate 21.

According to this embodiment, the primary beam shaping plate 42 can reduce the amount of electrons with which to irradiate the beam shaping aperture plate 21, compared to a case of using the slit 41a of the primary beam shaping plate 41. Thus, deterioration or damage of the beam shaping aperture plate 21 can be prevented more effectively.

Moreover, the current amount of the electron beams $EB_{11}$ is reduced by the primary beam shaping plate 42; therefore, chromatic aberration due to coulomb interaction of electrons (variation in speed of the electrons) can be reduced, allowing improvement in the fineness of exposure patterns.

Fourth Embodiment

Figure 10:
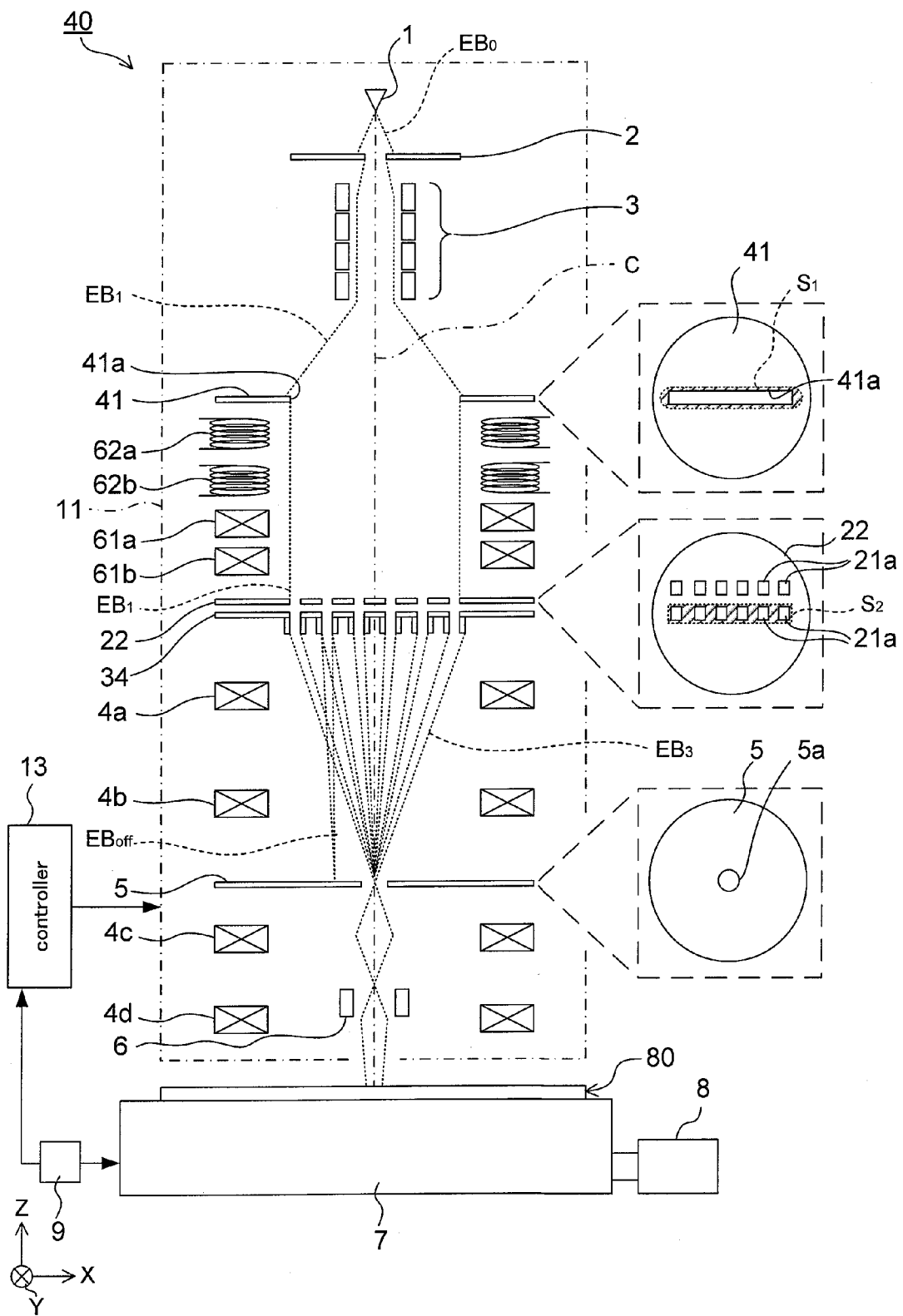
FIG. 10 is a block diagram of an electron beam exposure apparatus according to a fourth embodiment.

FIG. 10 is a block diagram of an electron beam exposure apparatus 40 according to a fourth embodiment. Note that configurations of the electron beam exposure apparatus 40 which are the same as those of the electron beam exposure apparatuses 10, 20, and 30 described with reference to FIGS. 2 to 9 are denoted by the same reference numerals as those used in FIGS. 2 to 9, and are not described in detail.

As shown in FIG. 10, the electron beam exposure apparatus 40 of this embodiment has a beam shaping aperture plate 22 provided with a plurality of lines of aperture portions 21a, a blanker plate 34 corresponding to the beam shaping aperture plate 22, first and second selecting deflectors 62a and 62b for selecting between the lines of the aperture portions 21a.

Figure 11:
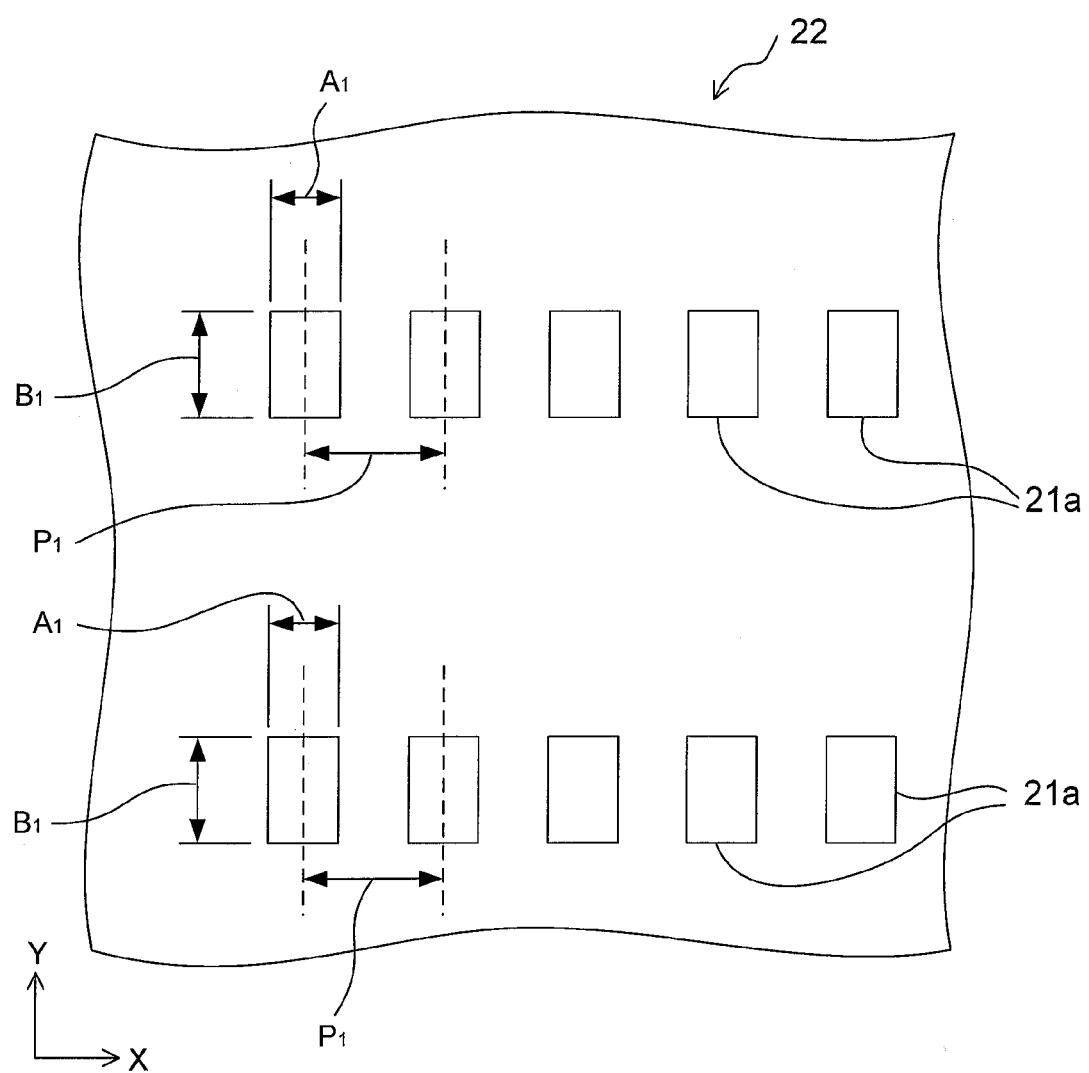
FIG. 11 is a plan view of a beam shaping aperture plate in FIG. 10.

FIG. 11 is a partially enlarged view of the beam shaping aperture plate 22 according to this embodiment.

As shown in FIG. 11, the beam shaping aperture plate 22 of this embodiment is provided with at least two lines of aperture portions 21a arranged in the X direction, the lines being apart from each other in the Y direction. The aperture portions 21a of one line and the aperture portions 21a of the other line have the same shape and located at positions coinciding in the X direction. Although there are two lines of the aperture portions 21a in the example shown in FIG. 11, this embodiment is not limited to this, and may have three or more lines.

As shown in FIG. 10, the blanker plate 34 is placed below the beam shaping aperture plate 22.

Figure 12:
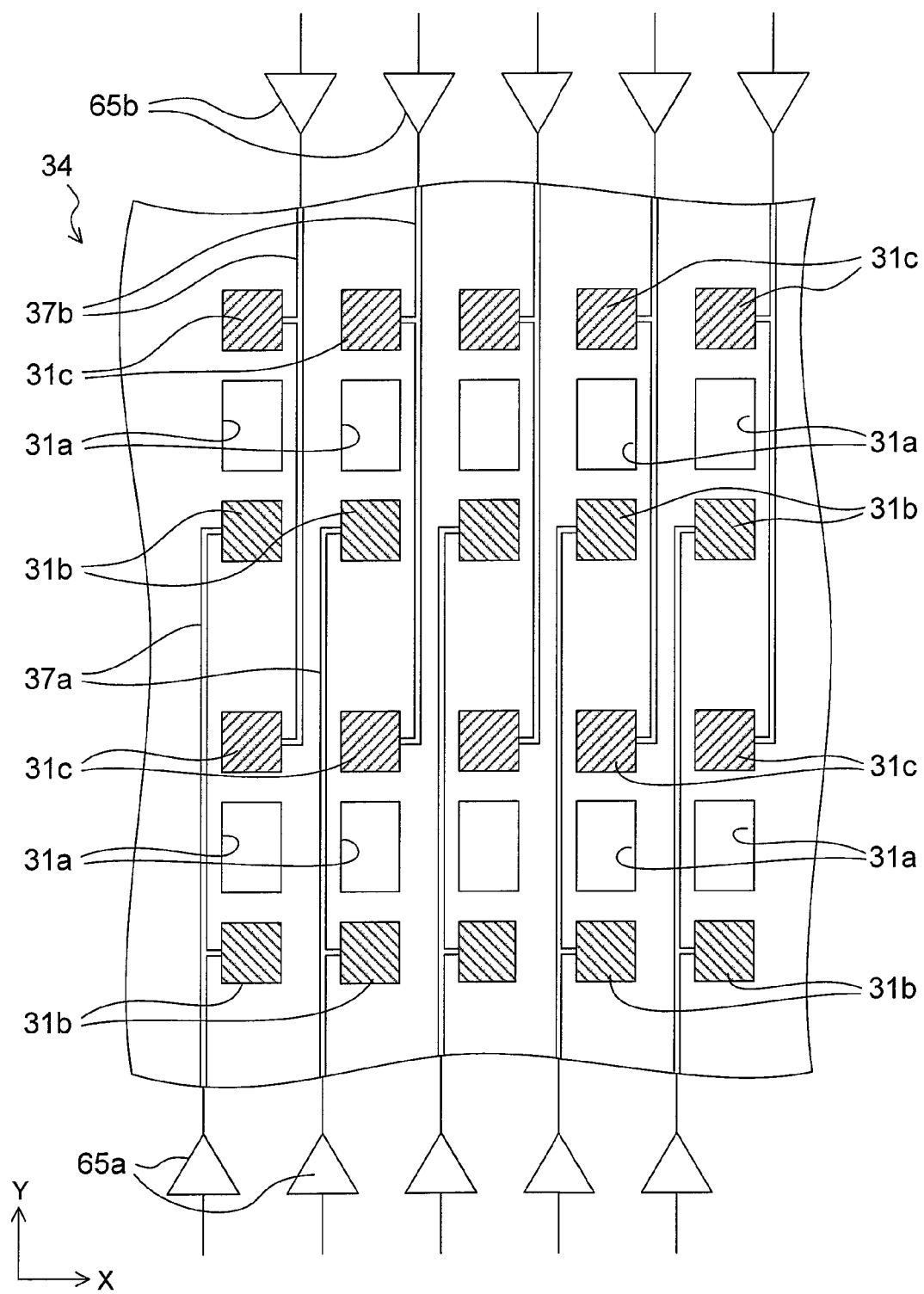
FIG. 12 is a plan view of a blanker plate in FIG. 10.

FIG. 12 is a plan view of the blanker plate 34. This blanker plate 34 is provided with aperture portions 31a at portions corresponding to the aperture portions 21a of the beam shaping aperture plate 22. Each aperture portion 31a is larger than each aperture portion 21a, and allows an electron beam having passed through the aperture portion 21a to pass therethrough.

The blanking electrodes 31b, 31c are provided on the respective sides of each aperture portion 31a. In this embodiment, the blanking electrodes 31b for the aperture portions 31a formed at positions coinciding in the X direction are connected to each other in parallel via an interconnection 37a, and the blanking electrodes 31c for the aperture portions 31a formed at positions coinciding in the X direction are connected to each other in parallel via an interconnection 37b.

This eliminates the need for increasing the number of drive circuits 65a, 65b even if the aperture portions 31a arranged in parallel are increased in number. This can simplify the configuration of the apparatus.

Further, as shown in FIG. 10, the first selecting deflector 62a and the second selecting deflector 62b are provided above the beam shaping aperture plate 22.

The first selecting deflector 62a deflects the electron beam $EB_1$ having passed through the primary beam shaping plate 41 in the Y direction, and the second selecting deflector 62b aligns the electron beam $EB_1$ having been deflected by the first selecting deflector 62a so that the electron beam $EB_1$ may be in parallel with the optical axis C.

Figure 13:
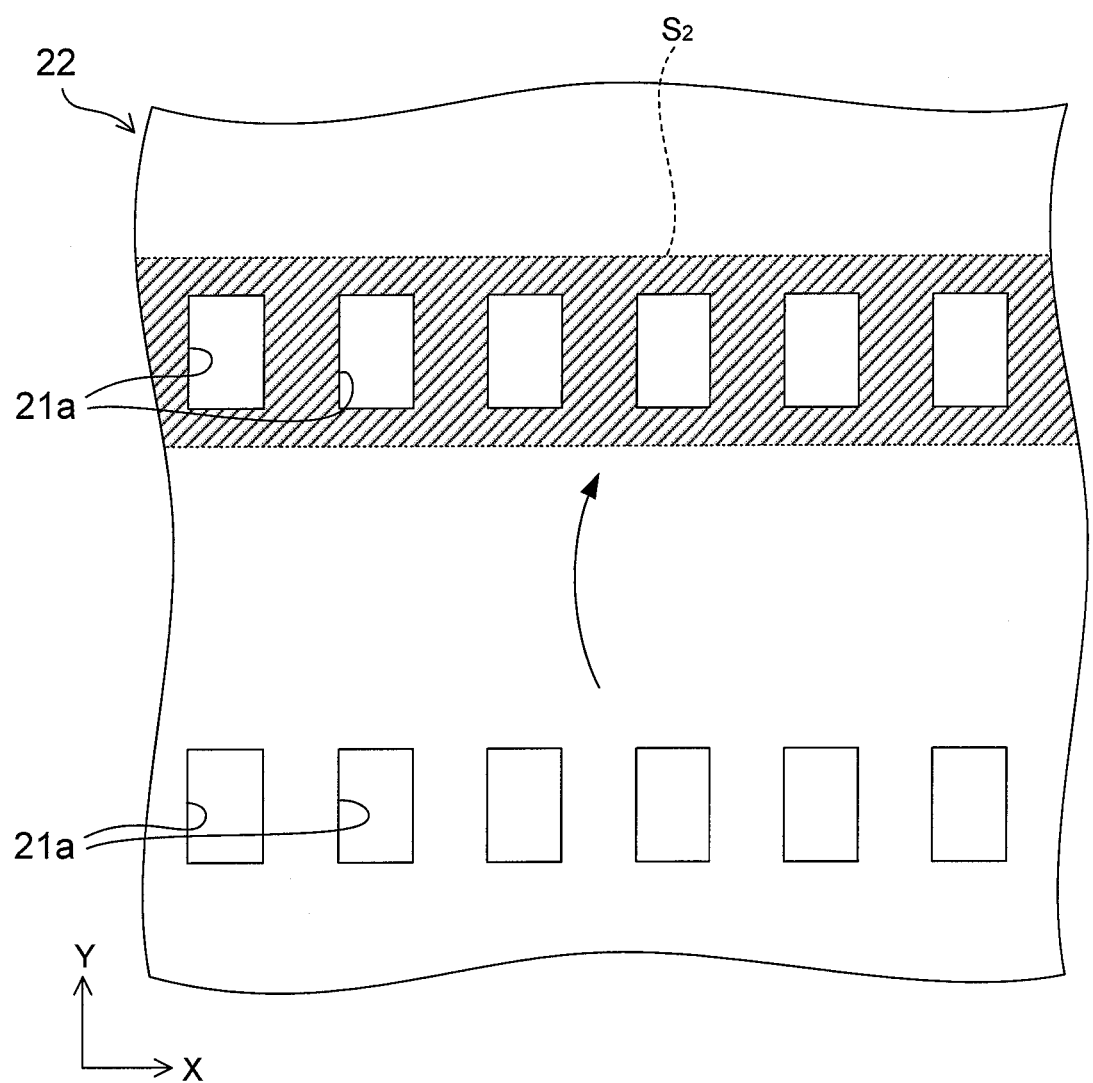
FIG. 13 is a diagram showing how selecting deflectors in FIG. 10 change a position on the beam shaping aperture irradiated with an electron beam.

FIG. 13 is a diagram showing how the selecting deflectors 62a, 62b change the irradiation region $S_2$ for the electron beam $EB_1$.

As the arrow in FIG. 13 shows, the first selecting deflector 62a and the second selecting deflector 62b can switch the irradiation region $S_2$ to a different line of the aperture portions 21a on the beam shaping aperture plate 22.

When exposure is performed for a long period of time using the electron beam exposure apparatus 40, any of the electron beams $EB_3$ might experience abnormality due to abnormal blanking operation of the aperture portions 31a of the blanker plate 34 or deterioration of the beam shaping aperture plate 21.

Even in such a case, as shown in FIG. 13, the exposure can be continued without stopping the electron beam exposure apparatus 40 by switching to a different line of the aperture portions 21a by use of the selecting deflectors 62a, 62b.

Another Example of the Fourth Embodiment

Figure 14:
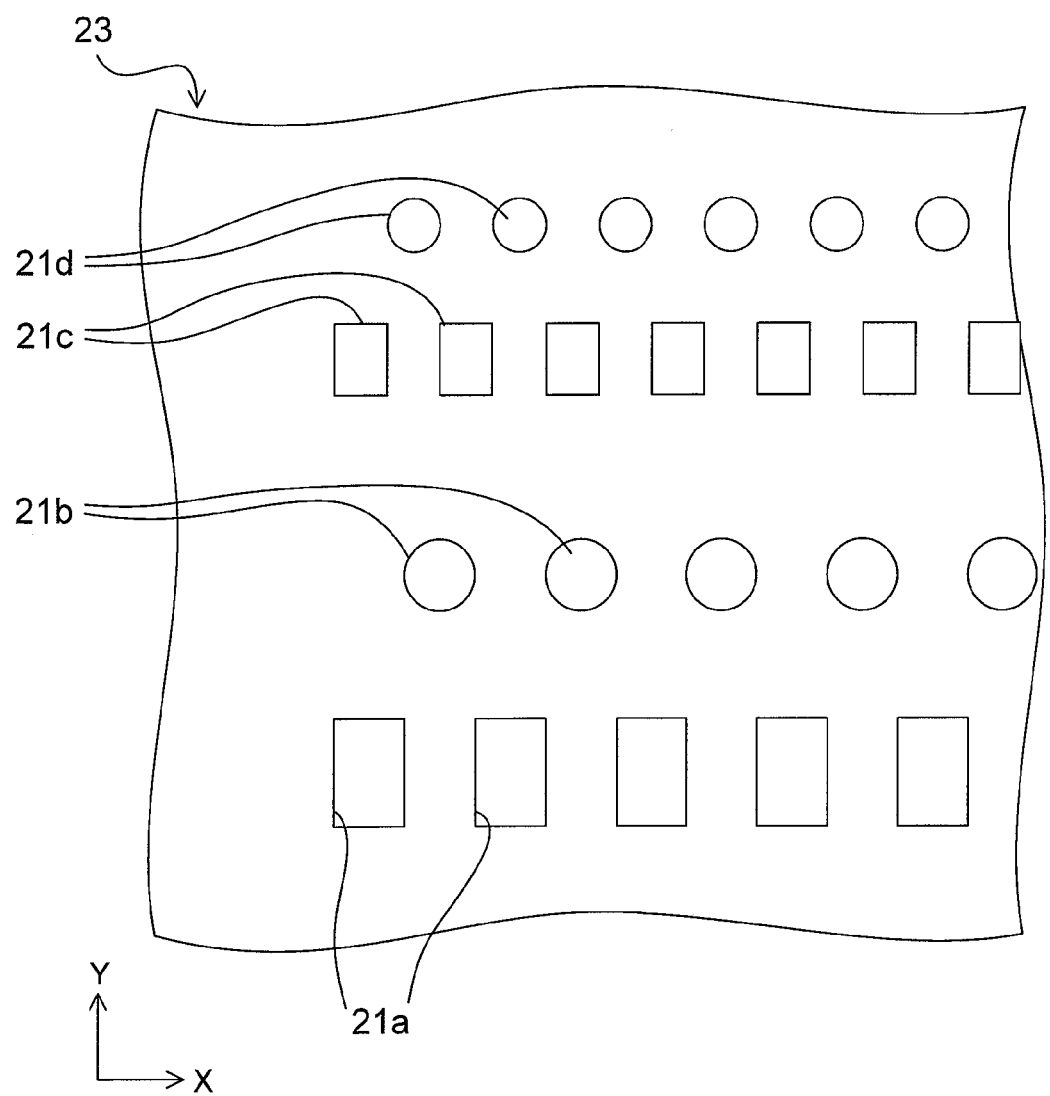
FIG. 14 is a block diagram of an electron beam exposure apparatus according to a modification of the fourth embodiment.

FIG. 14 is a partially enlarged view of a beam shaping aperture plate 23 according to a modification of the fourth embodiment.

As shown in FIG. 14, the beam shaping aperture plate 23 of this modification is provided with a plurality of lines of aperture portions, namely, a line of aperture portions 21a to a line of aperture portions 21d, the aperture portions being different in shape, size, and pitch from one line to another.

Specifically, the beam shaping aperture plate 23 is provided with a line of the aperture portions 21a for cut patterns and a line of the aperture portions 21b for via-hole patterns, and for a different process node, a line of aperture portions 21c for cut patterns and a line of aperture portions 21d for via-hole patterns.

In this modification, switch can be made between exposure of cut patterns and exposure of via-hole patterns by changing the irradiation position of the electron beam $EB_1$ from the line of the aperture portions 21a to the line to the aperture portions 21b by use of the selecting deflectors 62a, 62b.

Further, to perform exposure for the sample 80 on which wiring patterns for different process nodes coexist, the exposure can be continued by changing the irradiation position of the electron beam $EB_1$ from, for example, the line of the aperture portions 21a to the line of the aperture portions 21c.

Thereby, the beam shaping aperture plate does not need to be changed. Thus, exposure of cut patterns or via-hole patterns can be performed without stopping the electron beam exposure apparatus 40.

Fifth Embodiment

Figure 15:
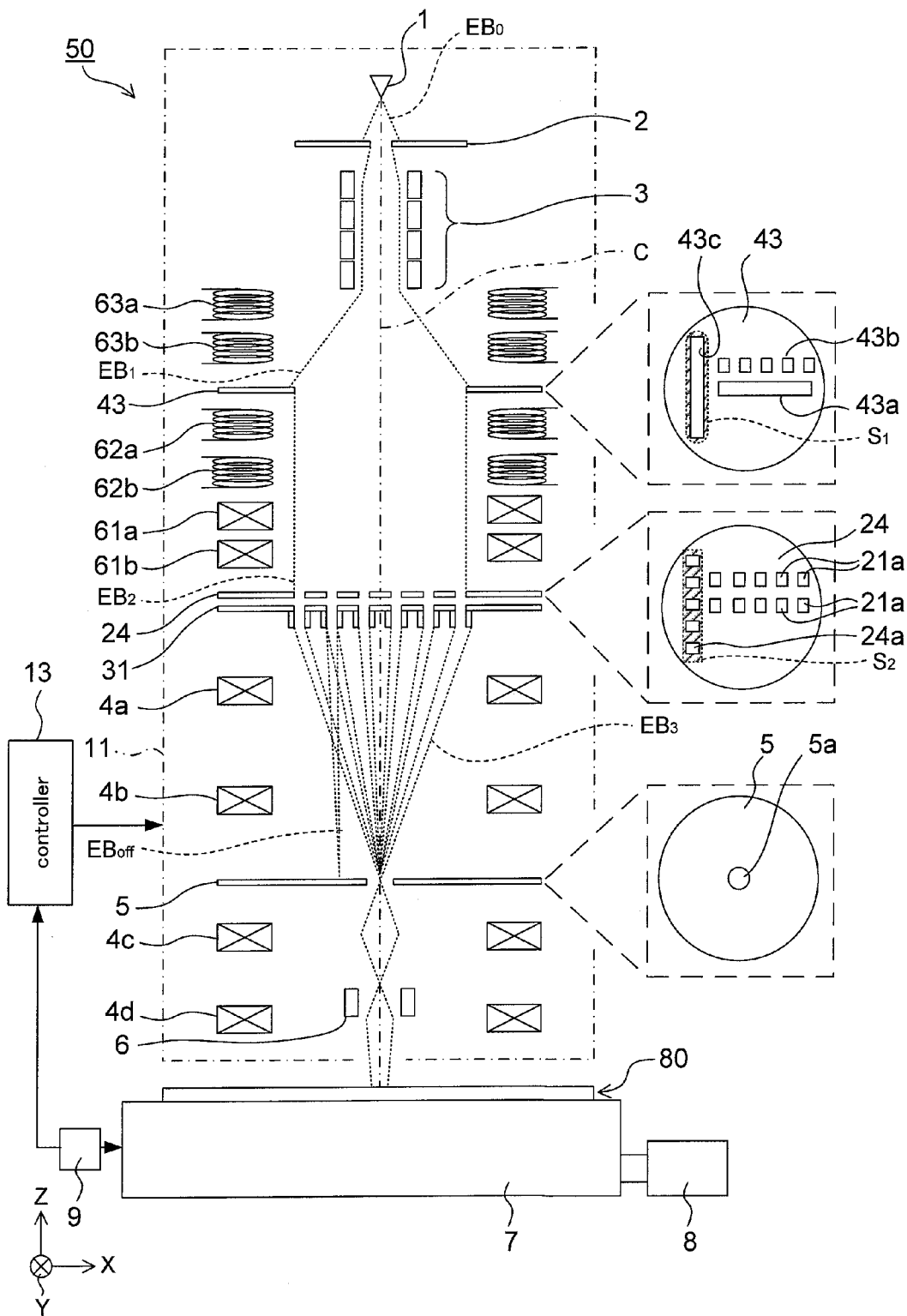
FIG. 15 is a block diagram of an electron beam exposure apparatus according to a fifth embodiment.

FIG. 15 is a block diagram of an electron beam exposure apparatus 50 according to a fifth embodiment. Note that configurations of the electron beam exposure apparatus 50 which are the same as those of the electron beam exposure apparatuses 10, 20, 30, and 40 shown in FIGS. 2 to 14 are denoted by the same reference numerals as those used in FIGS. 2 to 14, and are not described in detail.

As shown in FIG. 15, the electron beam exposure apparatus 50 includes electromagnetic deflectors 63a, 63b between the asymmetric illumination optical system 3 and the primary beam shaping plate 42. The electromagnetic deflectors 63a, 63b are configured to adjust the irradiation position of the electron beam $EB_1$ on a primary beam shaping plate 43.

The primary beam shaping plate 43 is provided with a plurality of apertures 43a, 43b, 43c. The aperture 43a is a slit elongated in the X direction, and the apertures 43b are rectangular apertures arranged in a line in the X direction. The aperture 43c is a slit elongated in the Y direction.

In the electron beam exposure apparatus 50 of this embodiment, the electromagnetic deflectors 63a, 63b are used to irradiate one of the apertures 43a to 43c with the elongated electron beam $EB_1$.

An aperture elongated in the Y direction, like the aperture 43c, can be irradiated with the electron beam $EB_1$ by shifting, by 90° around the optical axis, a combination of voltages to be applied to the electrodes 51a of the asymmetric illumination optical system 3 (electrostatic quadrupole deflector) shown in FIG. 3.

A beam shaping aperture plate 24 is provided below the primary beam shaping plate 43. The beam shaping aperture plate 24 of this embodiment is provided with a plurality of aperture portions 21a, 24a at positions corresponding to the apertures 43a, 43b, 43c of the primary beam shaping plate 43. Among the aperture portions 21a, 24a, the aperture portions 24a are arranged in a line in the Y direction.

Electron beams having passed through the aperture portions 24a form a line in the Y direction. Thus, exposure of cut patterns for patterns extending in the Y direction can be performed by applying the electron beams while moving the stage device 7 in the X direction.

Hence, the electron beam exposure apparatus 50 of this embodiment enables exposure of cut patterns for the line patterns 81a extending in the X direction and cut patterns for the line patterns 81b extending in the Y direction without rotating the sample 80 by 90°.

Sixth Embodiment

Figure 16:
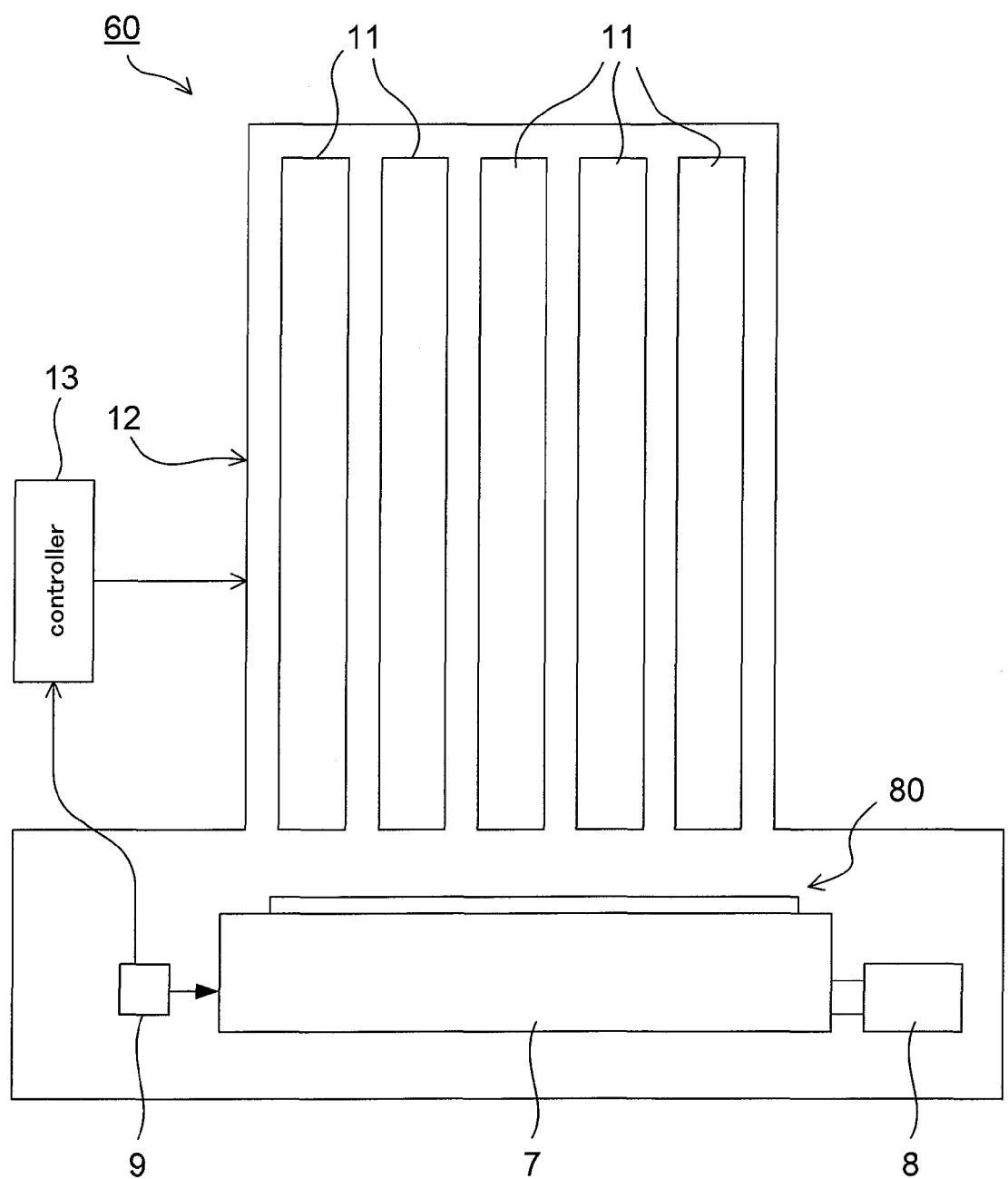
FIG. 16 is a block diagram of an electron beam exposure apparatus according to a sixth embodiment.

FIG. 16 is a block diagram of an electron beam exposure apparatus 60 according to a sixth embodiment. Note that configurations of the electron beam exposure apparatus 60 of this embodiment which are the same as those of the electron beam exposure apparatuses 10, 20, 30, 40, and 50 shown in FIGS. 2 to 15 are denoted by the same reference numerals as those used in FIGS. 2 to 15, and are not described in detail.

As shown in FIG. 16, the electron beam exposure apparatus 60 of this embodiment includes a plurality of column cells 11 inside a vacuum chamber 12, and the stage device 7 configured to retain the sample 80 is provided below these column cells 11. Each of the column cells 11 houses components constituting an electron optical system, such an electron gun, a beam shaping aperture plate, a blanker plate, a final aperture plate, a group of electromagnetic lenses, and a stage feedback deflector (see FIGS. 2 to 15). Each column cell 11 emits about, for example, two thousand electron beams $EB_3$.

Figure 17:
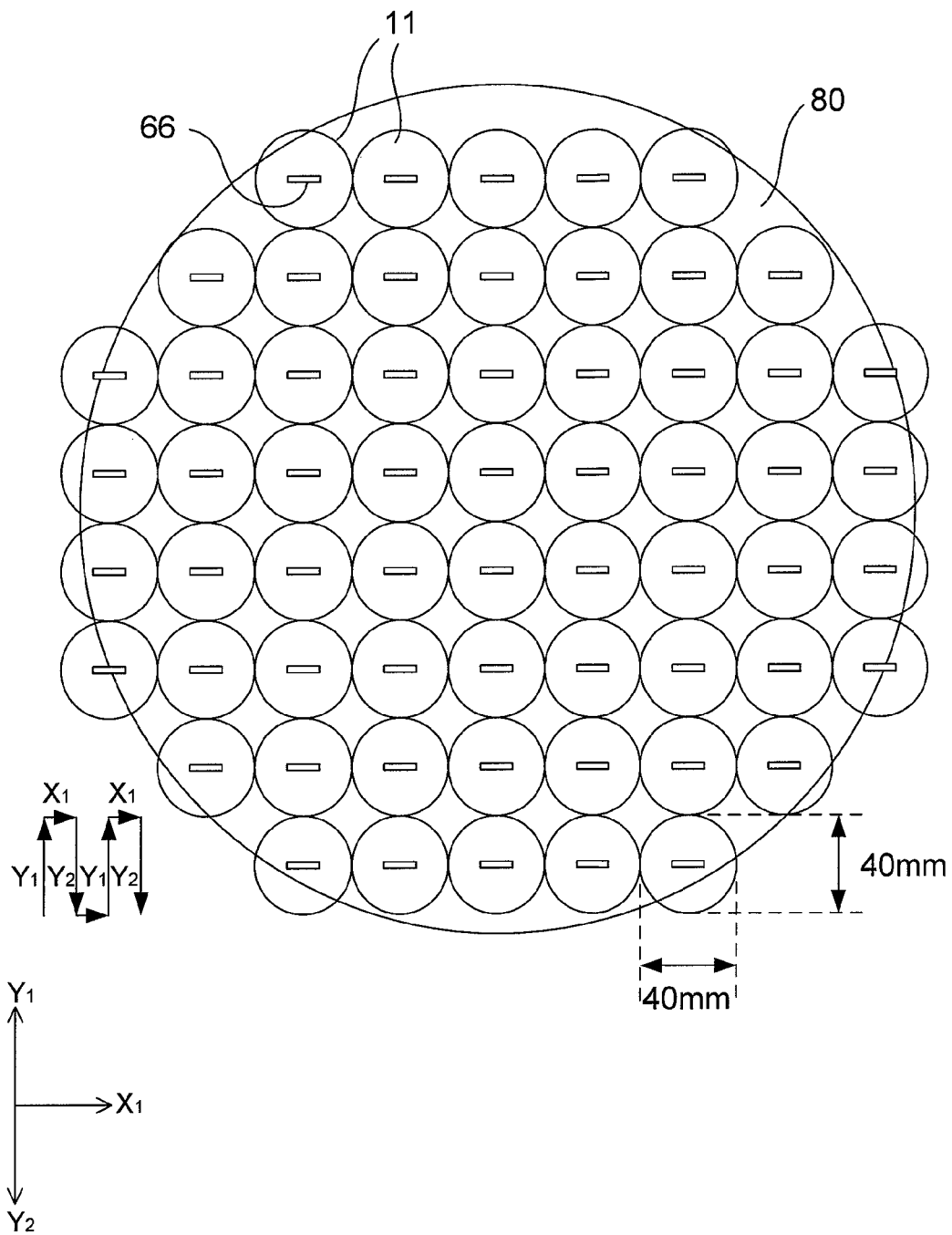
FIG. 17 is a diagram showing an example of how column cells are arranged in the electron beam exposure apparatus in FIG. 16.

FIG. 17 is a plan view showing an example of an arrangement of the column cells 11 of the electron beam exposure apparatus 60 in FIG. 16.

As shown in FIG. 17, the column cells 11 are each formed in a cylindrical shape having a diameter of about, for example, 40 mm. For example, sixty column cells 11 are arranged above a semiconductor wafer (the sample 80) having a diameter of 300 mm to 400 mm. The plurality of electron beams $EB_3$ generated by the column cells 11 are applied to irradiation regions 66 having a width shown in FIG. 17.

Exposure of cut patterns or via-hole patterns is performed with respect to a surface of the sample 80 while moving the sample 80 in a $Y_1$ or $Y_2$ direction as shown with the arrows in FIG. 17. After moving the sample 80 about 40 mm, which is as long as the pitch of the column cells 11, in the $Y_1$ or $Y_2$ direction, the sample 80 is moved a distance corresponding to the width of the irradiation region 66 in an $X_1$ direction, and then moved in the $Y_1$ or $Y_2$ direction. Exposure is thus performed.

According to this embodiment, exposure is performed using the plurality of column cells 11 to use many electron beams at the same time; therefore, throughput of exposure improves more.

In a case where sixty column cells 11 each configured to generate two thousand electron beams $EB_3$ are provided, exposure can be performed with 120,000 electron beams $EB_3$ in total.

The speed of exposure was estimated provided that the exposure is performed with respect to a resist having a sensitivity of 100 $\mu C/cm^2$ with the column cells 11 being arranged in number which makes an area exposed by each column cell 11 about 900 $mm^2$. As a result, it was confirmed that about ten wafers can be processed per hour.

What is claimed is:

1. A charged particle beam exposure apparatus comprising:
    a charged particle source configured to emit a charged particle beam,
    a beam shaping aperture plate including a plurality of apertures arranged in a line and being configured to shape the charged particle beam into a plurality of charged particle beams;
    a blanker plate including aperture portions and blanking electrodes and being configured to deflect the charged particle beams individually, the aperture portions being provided at portions corresponding to the apertures of the beam shaping aperture plate;
    a final aperture plate configured to block the charged particle beams deflected by the blanker plate and pass therethrough the charged particle beams not deflected by the blanker plate;
    a charged particle optical system configured to reduce in size the plurality of charged particle beams shaped by the beam shaping aperture plate and form an image thereof;
    a stage device configured to retain and move a semiconductor substrate on which a plurality of line patterns are formed at a certain pitch;
    an asymmetric illumination optical system placed between the charged particle source and the beam shaping aperture plate and configured to deform the charged particle beam emitted from the charged particle source into a beam having a section elongated along the line of the apertures of the beam shaping aperture plate;
    a controller configured to perform exposure of a predetermined pattern on the semiconductor substrate by moving the stage device and turning the plurality of charged particle beams on or off with the movement of the stage device; and
    a stage feedback deflector, provided below the final aperture plate, having a pair of electrode plates arranged along the line of the aperture portions of the beam shaping aperture plate, and configured to perform fine adjustment of the irradiation position of the electron beams to follow the line pattern of the sample; and
    a selecting deflector placed between the asymmetric illumination optical system and the beam shaping aperture plate and configured to change a position on the beam shaping aperture plate irradiated with the charged particle beam.

2. The charged particle beam exposure apparatus according to claim 1, wherein
    the asymmetric illumination optical system includes electrostatic quadruple electrodes.

3. The electron beam exposure apparatus according to claim 2, wherein
the controller configured to perform exposure of the predetermined pattern on the semiconductor substrate moves the stage device in a direction orthogonal to the line of the apertures of the beam shaping aperture plate and turns the plurality of charged particle beams on or off in synchronization.

4. The charged particle beam exposure apparatus according to claim 3, wherein
the apertures of the beam shaping aperture plate are arranged at a pitch equal to a product of the pitch of the line patterns on the semiconductor substrate and a reduction rate of the charged particle optical system.

5. The charged particle beam exposure apparatus according to claim 4, wherein
the beam shaping aperture plate has a plurality of the lines of the apertures.

6. The charged particle beam exposure apparatus according to claim 5, wherein
the apertures in the lines of the apertures of the beam shaping aperture plate have the same shape and arranged at the same pitch.

7. The charged particle beam exposure apparatus according to claim 6, wherein
the aperture portions of the same size and the blanking electrodes are arranged in a plurality of lines at the same pitch, and
the blanking electrodes adjacent in a direction orthogonal to the lines are connected to each other in parallel.

8. The charged particle beam exposure apparatus according to claim 5, wherein
the plurality of lines of the apertures of the beam shaping aperture plate are different from one another in shape and arrangement pitch of the apertures.

9. The charged particle beam exposure apparatus according to claim 2, further comprising
a primary beam shaping plate placed between the asymmetric illumination optical system and the beam shaping aperture plate and configured to restrict charged particles reaching the beam shaping aperture plate.

10. The charged particle beam exposure apparatus according to claim 5, wherein
the selecting deflector is placed between the primary beam shaping plate and the beam shaping aperture plate.

11. The charged particle beam exposure apparatus according to claim 1, wherein
the blanking electrodes of the blanker plate are provided on a side from which the charged particle beams are emitted.

12. The charged particle beam exposure apparatus according to claim 1, further comprising:
a position detector configured to detect a positional shift of the stage device; and
a stage feedback deflector configured to finely adjust irradiation positions of the plurality of charged particle beams based on a result of the detection by the position detector.

13. A charged particle beam exposure apparatus comprising:
a stage device configured to retain and move a semiconductor substrate on which a plurality of line patterns are formed at a certain pitch;
a plurality of column cells placed above the stage device and each configured to generate a plurality of charged particle beams;
a controller configured to draw a predetermined pattern on the semiconductor substrate by moving the stage device in a certain direction reciprocally and turning the plurality of charged particle beams on or off in synchronization with the movement of the stage device, wherein
each of the column cells includes
a charged particle source configured to emit a charged particle beam,
a beam shaping aperture plate including a plurality of apertures and being configured to shape the charged particle beam into a plurality of charged particle beams,
a blanker plate including aperture portions and blanking electrodes and being configured to deflect the charged particle beams individually, the aperture portions being provided at portions corresponding to the apertures of the beam shaping aperture plate,
a final aperture plate provided with an aperture and configured to block the charged particle beams deflected by the blanker plate and pass therethrough the charged particle beams not deflected by the blanker plate, and
a charged particle optical system configured to reduce in size the plurality of charged particle beams shaped by the beam shaping aperture plate and form an image thereof, and
the apertures of the beam shaping aperture plate are arranged in a line in a direction orthogonal to the direction in which the stage device is moved reciprocally; and
a stage feedback deflector, provided below the final aperture plate, having a pair of electrode plates arranged along the line of the aperture portions of the beam shaping aperture plate, and configured to perform fine adjustment of the irradiation position of the electron beams to follow the line pattern of the sample; and
a selecting deflector placed between the asymmetric illumination optical system and the beam shaping aperture plate and configured to change a position on the beam shaping aperture plate irradiated with the charged particle beam.

14. The charged particle beam exposure apparatus according to claim 13, wherein
each of the column cells has an asymmetric illumination optical system placed between the charged particle source and the beam shaping aperture plate and configured to deform the charged particle beam emitted from the charged particle source into a beam having a section elongated along the line of the apertures of the beam shaping aperture plate.

* * * * *